(12) United States Patent
Silic

(10) Patent No.: US 6,867,574 B2
(45) Date of Patent: Mar. 15, 2005

(54) SWITCH MODE POWER SUPPLY AND DRIVING METHOD FOR EFFICIENT RF AMPLIFICATION

(75) Inventor: Bojan Silic, San Jose, CA (US)

(73) Assignee: Tropian, Inc., Cupertino, CA (US)

( * ) Notice: Subject to any disclaimer, the term of this patent is extended or adjusted under 35 U.S.C. 154(b) by 382 days.

(21) Appl. No.: 09/992,049

(22) Filed: Nov. 21, 2001

(65) Prior Publication Data

US 2003/0210021 A1 Nov. 13, 2003

(51) Int. Cl.[7] ................................................. G05F 1/40
(52) U.S. Cl. ....................................... 323/284; 323/288
(58) Field of Search ................................. 323/282, 284, 323/285, 288, 289, 271; 307/109, 125, 31; 327/108

(56) References Cited

U.S. PATENT DOCUMENTS

| | | | |
|---|---|---|---|
| 4,967,109 A | 10/1990 | Steigerwald | |
| 5,612,582 A | 3/1997 | Shichi et al. | |
| 5,811,948 A | * 9/1998 | Sato et al. | 323/271 |
| 6,801,063 B1 | * 10/2004 | Guo | 327/108 |
| 2004/0017111 A1 | * 1/2004 | May | 307/31 |

FOREIGN PATENT DOCUMENTS

| | | |
|---|---|---|
| DE | 198 51 909 A1 | 11/1998 |
| JP | 02-182020 | 1/1989 |

OTHER PUBLICATIONS

International Search Report, PCT/US 02//38923, International filing date Nov. 21, 2002, date Search Report mailed Jun. 5, 2003.

* cited by examiner

Primary Examiner—Jessica Han
(74) Attorney, Agent, or Firm—Thelen Reid & Priest LLP (57) ABSTRACT

The present invention, generally speaking, provides a power-efficient method of driving a switch mode power supply at higher frequencies than those typically attainable in the prior art. In an exemplary embodiment, driver transistors exhibit gate capacitance, which is exploited by charging the gate capacitance using a pulse signal and thereafter allowing the gate capacitance to discharge. With the gate capacitance charged, the driver transistor remains on for the desired period of time even without a drive signal being continuously applied, thus conserving power. In essence, the gate capacitance is exploited in the manner of a memory cell. Furthermore, at higher-frequency operation, instead of the gate capacitance being fully charged, leading to increased turn-off time, the gate capacitance is only partially charged, allowing for quicker turn around. The envelope-following capability of the switch mode power supply, in telecommunications applications, is therefore increased. In accordance with another aspect of the invention, in RF amplification circuit having a phase path and a magnitude path, an amplifier is provided having at least a final stage, the amplifier having an RF input coupled to the phase path; and a switch mode power supply is coupled to an operational voltage and to a power supply input terminal of the amplifier. The switch mode power supply includes a transistor switch, a driver circuit for driving the transistor switch, and a controller, the controller causing the driver circuit to operate in charge transfer mode in which a pulse of short duration relative to a duty cycle of the switch mode power supply is used to turn on the transistor switch.

12 Claims, 6 Drawing Sheets

Z - HIGH OUTPUT IMPEDANCE
A - CURRENT SOURCED TO CHARGE Q5 GATE (CHARGE TRANSFER)
B - CURRENT SINK TO DISCHARGE Q5 GATE (CHARGE REMOVAL)

F = 2.4 MHz
$V_{DD}$ = 30.5 V

SWITCH MODE POWER SUPPLY AND DRIVING METHOD FOR EFFICIENT RF AMPLIFICATION

BACKGROUND OF THE INVENTION

1. Field of the Invention

The present invention relates to switch mode power supplies and driving methods, particularly for efficient RF amplification, as well as amplifier structures using the same.

2. State of the Art

As is well-known, the efficiency of power amplifiers such as those used in wireless telecommunications can be increased substantially using a variable power supply instead of a fixed power supply. In this application, as well as a wide variety of other applications, a switch mode power supply may be used to efficiently perform DC-to-DC conversion from a fixed DC power supply input to a variable supply output.

Figure 1:
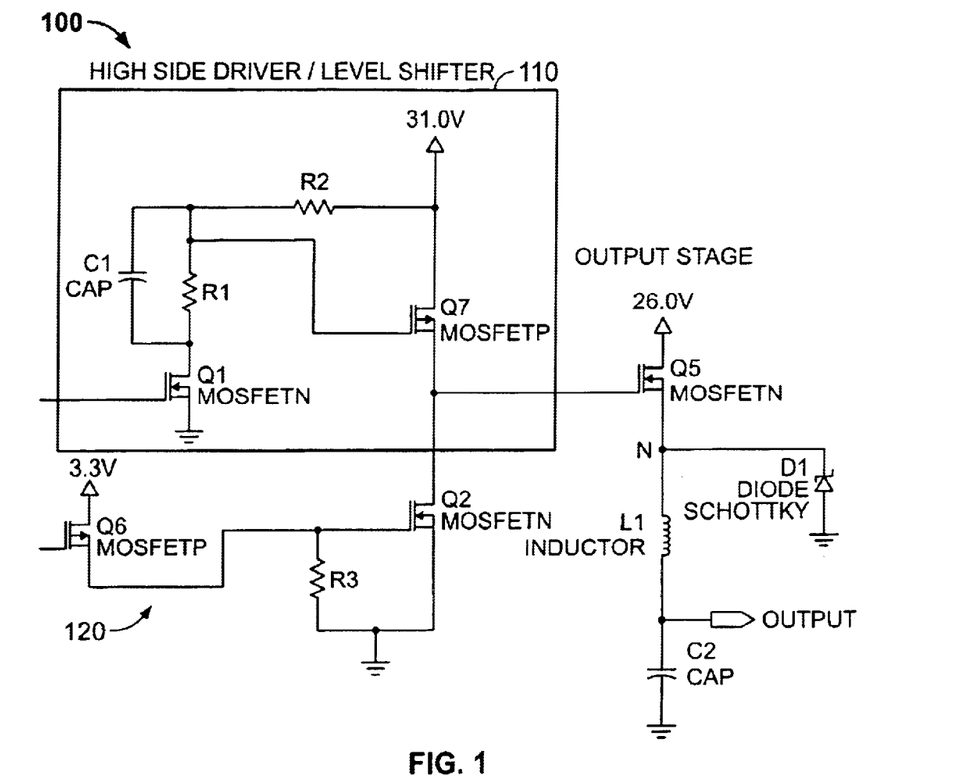
FIG. 1 is a diagram of a known switch mode power supply and driver circuit.

One example of a known switch mode power supply (in particular a buck converter) and associated driver circuit is shown in FIG. 1. A transistor switch Q5 (in this instance a N-FET device) is alternately switched ON and OFF in accordance with some duty cycle during an ON portion of which an operational voltage $V_{DD}$ is coupled to an output filter. The output filter may take the form of a series LC circuit, where the output voltage is taken at a circuit node N in-between an inductor L1 and a capacitor C2. In addition, a Schottky diode D1 is provided to clamp the negative voltage spike induced in the inductor when the switch is turned OFF, forcing the output voltage positive and protecting the transistor Q5.

A driving circuit for the buck converter includes a high-side driver/level shifter 110 and a low-side driver 120.

The low-side driver 120 includes a transistor switch Q2 coupled between a gate electrode of the transistor Q5 and a reference potential, e.g., ground. During the OFF portion of the duty cycle, the transistor Q2 is turned on, grounding the gate of the transistor Q5, causing it to turn off. A gate electrode of the transistor Q2 may be driven directly by a control circuit or, as in the illustrated embodiment, the drive level applied to the gate electrode may be controlled using a transistor/resistor combination. Where the Q2 source electrode needs to be biased negative with respect to ground, the transistor Q6 and the resistor R3 provide level shifting in the negative direction.

The high-side driver/level shifter 110 includes a transistor Q7 (e.g., a P-FET) coupled between an operational voltage $V_{SS}$ ($V_{SS} > V_{DD}$) and the gate of the transistor Q5. During the ON portion of the duty cycle, the transistor Q7 is turned on, raising the gate of the transistor Q5 and causing it to turn on. A remaining portion of the high-side driver/level shifter performs a level-shifting function, allowing the transistor Q7 to be controlled using a logic-level signal. In particular, a resistive voltage divider network (series-connected resistors R1 and R2) is coupled from the voltage $V_{SS}$ through a transistor Q1 to ground. An intermediate node between the resistors R1 and R2 is coupled to a gate electrode of the transistor Q7. When the transistor Q1 is turned on, current flows through the voltage divider, causing a voltage to be applied to the gate of the transistor Q7 sufficient to turn it on.

One of the challenges presented in designing the level-shifting circuit is to maintain efficiency. A capacitor C1 coupled in parallel with the resistor RI improves efficiency.

More particularly, the driving impedance for the gate of transistor Q7 must be minimized to rapidly switch on the transistor Q7. The turn-off time, on the other hand, can be as long as the period of the minimum allowed duty cycle for the power supply.

Without the capacitor C1, the driving impedance in the ON direction for the gate of the transistor Q7 is the ON resistance, Rds, of the transistor Q1 plus the resistance R1. It would be easy to minimize this impedance by making the resistor R1 equal to zero. However, the DC current through R1 and R2 would then be very high for as long as the transistor Q1 is ON. The value of the resistor R2 is chosen such that its combination with the gate-to-source capacitance, Cgs, of the transistor Q7 makes an RC time constant low enough to meet the minimum duty cycle requirement.

Adding the capacitor C1 momentarily lowers the drive impedance for the gate of the transistor Q7 down to the sum of the ON resistance of the transistor Q1 and the effective series resistance (ESR) of the capacitor C1. The capacitance Cgs of the transistor Q7 can then be charged up rapidly. The value of the capacitor C1 may be chosen to be approximately equal to the value of the capacitance Cgs of the transistor Q7. The value of the resistor R1 can then be made as high as that of the resistor R2, which makes the DC current smaller and increases efficiency.

Figure 2:
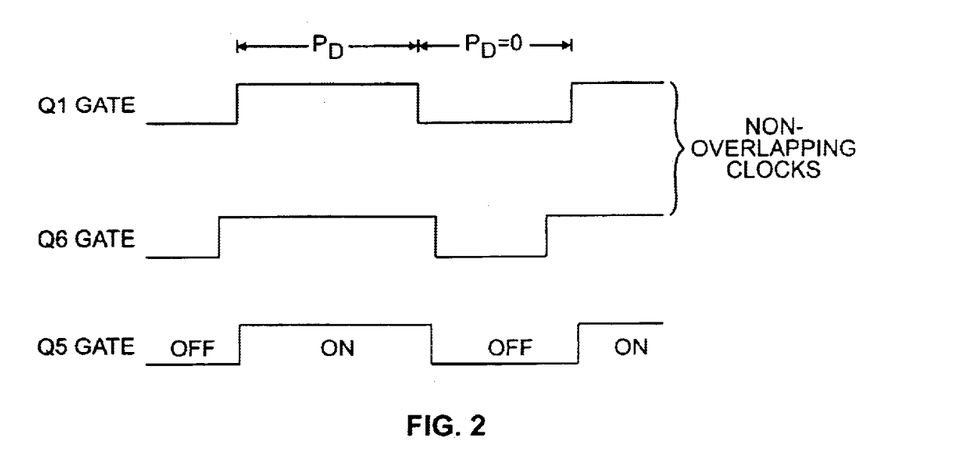
FIG. 2 is a waveform diagram illustrating conventional operation of the circuit of FIG. 1.

A waveform diagram illustrating operation of the circuit of FIG. 1 is shown in FIG. 2, showing waveforms applied to the gate electrodes of the transistors Q1 and Q6 in order to produce a waveform of the desired duty cycle on the gate electrode of the transistor Q5. As may be observed, the gate electrode of the transistor Q5 goes high when the gate electrode of the transistor Q1 goes high, and is driven low when the gate electrode of the transistor Q6 is driven low. To ensure non-overlapping operation of the transistors Q7 and Q2, the gate electrode of the transistor Q6 is raised (turning the transistor Q6 off) some small time before the gate electrode of the transistor Q1 is raised (turning the transistor Q1 on). Similarly, the gate electrode of the transistor Q1 is lowered (turning the transistor Q1 off) some small time before the gate electrode of the transistor Q6 is lowered (turning the transistor Q6 on).

The power consumption of the circuit of FIG. 1 is greater than desired. In particular, considerable power is dissipated by the resistive voltage divider network during the time that the gate electrode of the transistor Q1 is high.

Furthermore, the upper frequency limit at which the circuit of FIG. 1 can be operated is lower than desired. Where the switch mode power supply is used in next-generation wireless telecommunications applications, for example, it is desirable for the switch mode power supply to be able to track envelope variations of the telecommunications signal, requiring in some instances switching speeds upward of 2 MHz.

Figure 9:
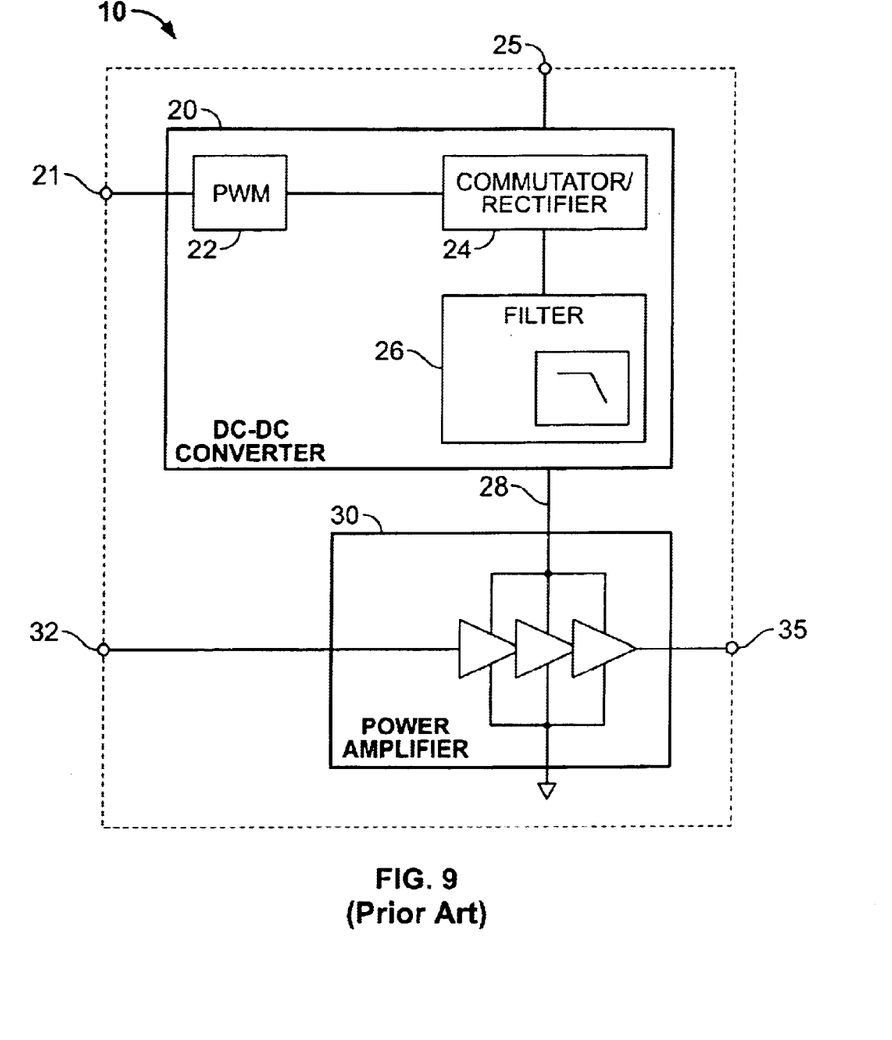
FIG. 9 is a diagram of a known RF power amplifier.

French Patent 2,768,574 also describes a switched-mode power amplifier arrangement. Referring to FIG. 9, in this arrangement, the power amplifier circuit comprises a DC-to-DC converter 20 and a power amplifier 30. The DC-to-DC converter 20 includes a pulse-width modulator 22, a commutator/rectifier 24 and a filter 26.

The pulse-width modulator 22 is coupled to receive a DC-to-DC command input signal from a signal input terminal 21, and is arranged to apply a pulse-width-modulated signal to the commutator/rectifier 24. The commutator/rectifier 24 is coupled to receive a DC-to-DC power supply input signal from a signal input terminal 25, and is also coupled to apply a switched signal to filter 26. The filter 26 in turn applies a filtered switched signal 28 in common to multiple stages of the power amplifier 30.

A circuit of the foregoing type is substantially limited by the frequency of the pulse-width modulator. In addition, common control of multiple power amplifier stages in the manner described may prove disadvantageous as described more fully hereinafter.

SUMMARY OF THE INVENTION

The present invention, generally speaking, provides a power-efficient method of driving a switch mode power supply at higher frequencies than those typically attainable in the prior art. In an exemplary embodiment, driver transistors exhibit gate capacitance, which is exploited by charging the gate capacitance using a pulse signal and thereafter allowing the gate capacitance to discharge. With the gate capacitance charged, the driver transistor remains on for the desired period of time even without a drive signal being continuously applied, thus conserving power. In essence, the gate capacitance is exploited in the manner of a memory cell. Furthermore, at higher-frequency operation, instead of the gate capacitance being fully charged, leading to increased turn-off time, the gate capacitance is only partially charged, allowing for quicker turn around. The envelope-following capability of the switch mode power supply, in telecommunications applications, is therefore increased. In accordance with another aspect of the invention, in RF amplification circuit having a phase path and a magnitude path, an amplifier is provided having at least a final stage, the amplifier having an RF input coupled to the phase path; and a switch mode power supply is coupled to an operational voltage and to a power supply input terminal of the amplifier. The switch mode power supply includes a transistor switch, a driver circuit for driving the transistor switch, and a controller, the controller causing the driver circuit to operate in charge transfer mode in which a pulse of short duration relative to a duty cycle of the switch mode power supply is used to turn on the transistor switch.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 3:
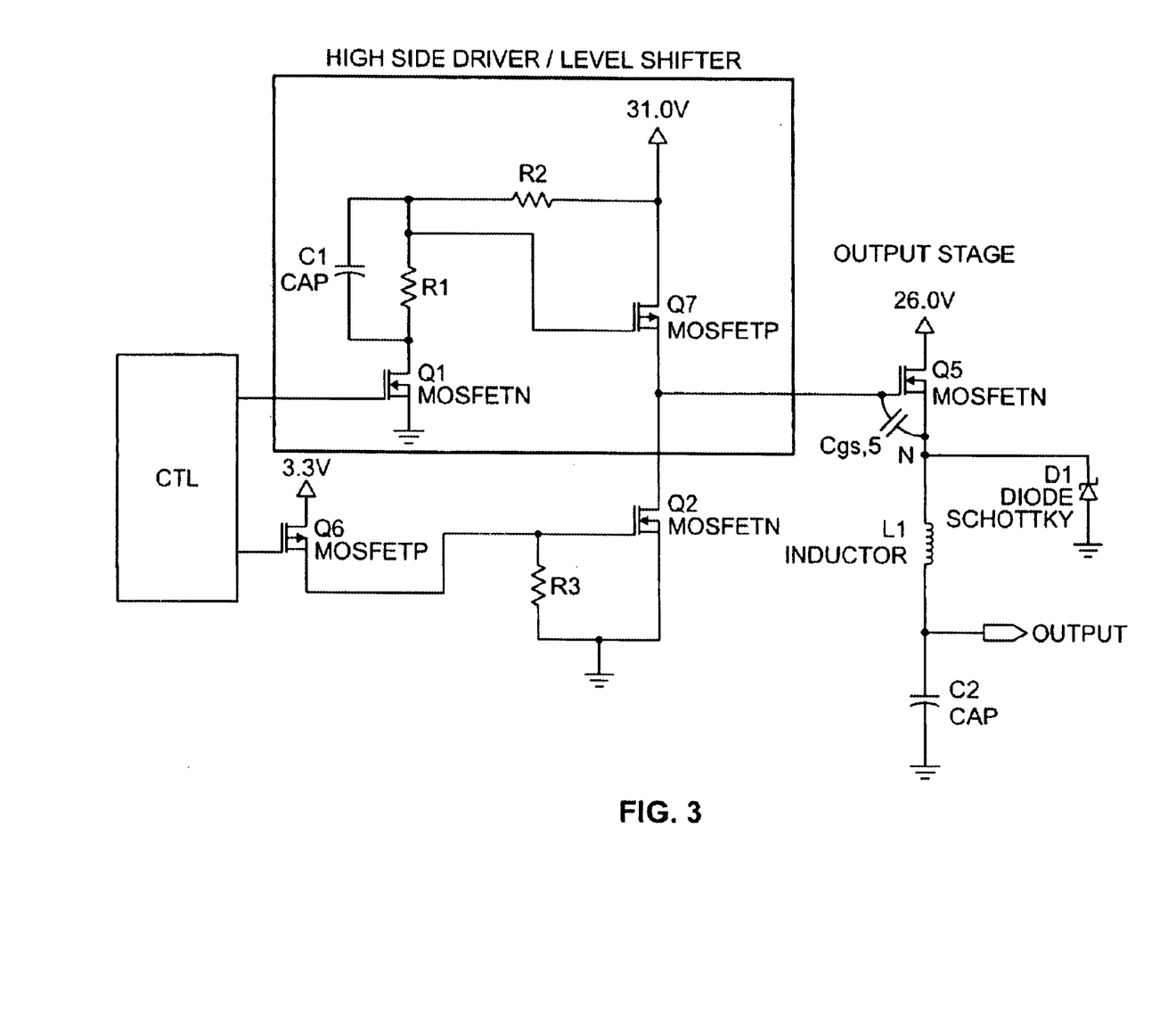
FIG. 3 is a diagram of a switch mode power supply in which a parasitic gate capacitance is used to advantage.
Figure 4:
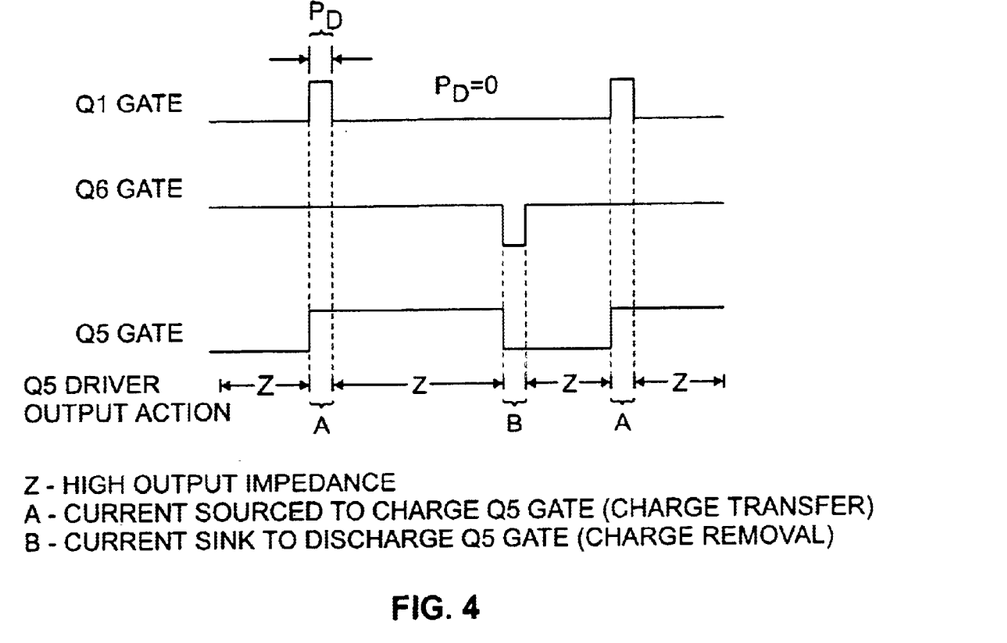
FIG. 4 is a waveform diagram illustrating the method of the invention in an exemplary embodiment thereof.

Referring now to FIG. 3 and FIG. 4, a diagram is shown of a switch mode power supply in which a parasitic gate capacitance $C_{gs,5}$ is used to advantage (FIG. 3), together with a waveform diagram (FIG. 4) illustrating the method of the invention in an exemplary embodiment thereof. To reduce power consumption in the resistive divider network of the circuit of FIG. 1, the time for which the gate electrode of the transistor Q1 is held high is minimized. In particular, the gate electrode of the transistor Q1 is pulsed high for a length of time calculated to charge the parasitic gate capacitance of the transistor Q5 and maintain the transistor in the ON state for up to the maximum expected positive portion of duty cycle.

At the point in time when the transistor Q5 is to be turned off, the gate electrode of the transistor Q6 is pulsed low, discharging the parasitic gate capacitance of the transistor Q5 and causing it to turn off.

Referring still to FIG. 4, the driver circuit alternates between three states, a charge transfer state (A), a charge removal state (B), and a high-impedance state (Z). The driver occupies states A and B only briefly; otherwise, the driver occupies state Z, the high-impedance state. Significant power dissipation occurs only in state A, and the time spent in state A is minimized.

In the foregoing arrangement, the capacitance of the main switch is used, in effect, as a one-bit memory element. That is, the circuit is operated in charge transfer mode, where the objective is to transfer a finite amount of charge from one place (the driver) to another (the switch) or back again. This manner of operation is entirely different from providing a voltage, or a current, on a circuit node.

Note that the parasitic capacitance need not be fully charged, as typically occurs in the prior art. Therefore, higher frequency operation may be obtained.

Figure 5:
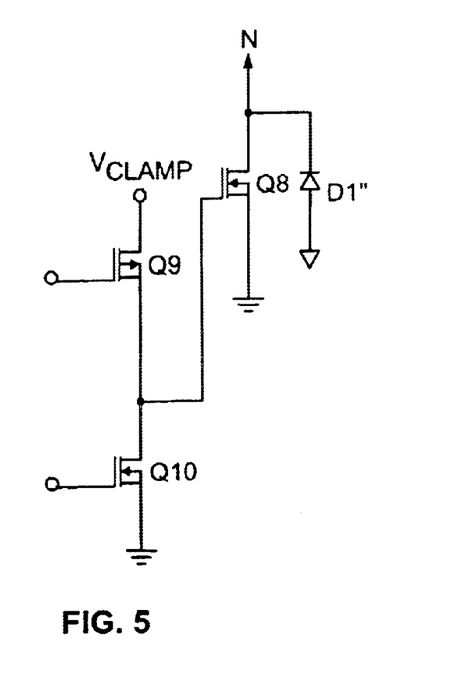
FIG. 5 is a diagram of an alternative embodiment of a switch mode power supply and driver circuit with which the present invention may be used.

To avoid losses occurring in the Schottky diode D1 and achieve still greater efficiency, the Schottky diode D1 may be replaced by the circuit of FIG. 5 to achieve synchronous rectification. In this arrangement, a clamping transistor (switch) Q8 is substituted for the Schottky diode D1, being coupled from a source electrode of the transistor Q5 (FIG. 1) to ground and controlled by the combination of a charge source transistor Q9 and a charge removal transistor Q10. A fast-junction clamp diode D1' is still coupled to the circuit node N, but its forward voltage is not critical.

Figure 6:
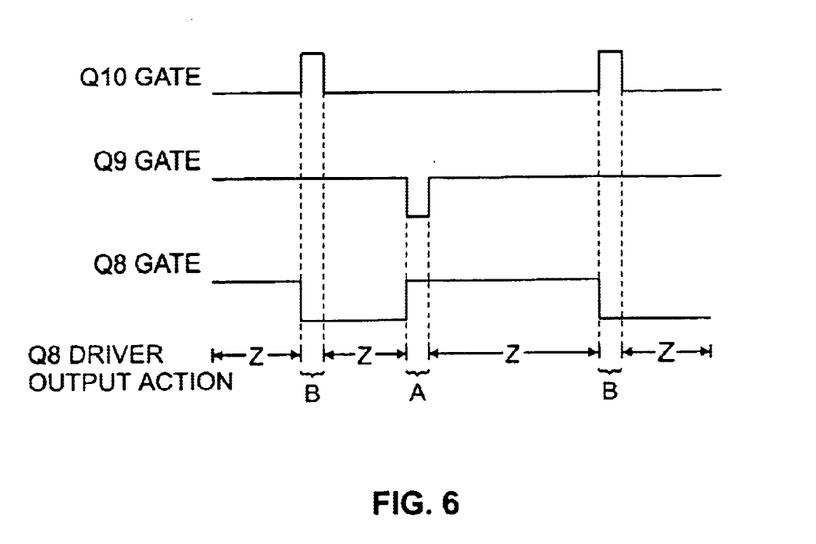
FIG. 6 is a waveform diagram illustrating operation of the circuit of FIG. 5.

Referring to FIG. 6, in operation, the transistor Q8 is turned on (making a connection to ground) when the transistor Q5 is turned OFF.

More particularly, when the transistor Q5 is turned OFF, the magnetic field in the inductor L1 collapses, inducing a reverse voltage across it. In the case of the circuit of FIG. 3, this reverse voltage forward biases the Schottky diode, and current flow is maintained through the output and the load. Losses in the Schottky diode are significant (P=Vf*I). The forward voltage drop is typically in the 0.5 to 1.0V range, and the current I may be in the 5A range. This loss is minimized in the circuit of FIG. 5 by turning ON the transistor Q8 which, in the ON condition, has a small voltage drop; e.g., Vf approaches 0.01V, while the current remains as before. Clamp power losses therefore drop by up to 1−0.01/1=99%, easily justifying the additional parts and slightly more complicated circuitry of FIG. 5.

The transistors Q9 and Q10 may be driven using the same method as with transistors Q1 and Q6. That is, when the transistor Q8 is to be turned on, the gate electrode of the transistor Q9 is pulsed; when the transistor Q8 is to be turned off, the gate electrode of the transistor Q10 is pulsed.

Figure 7:
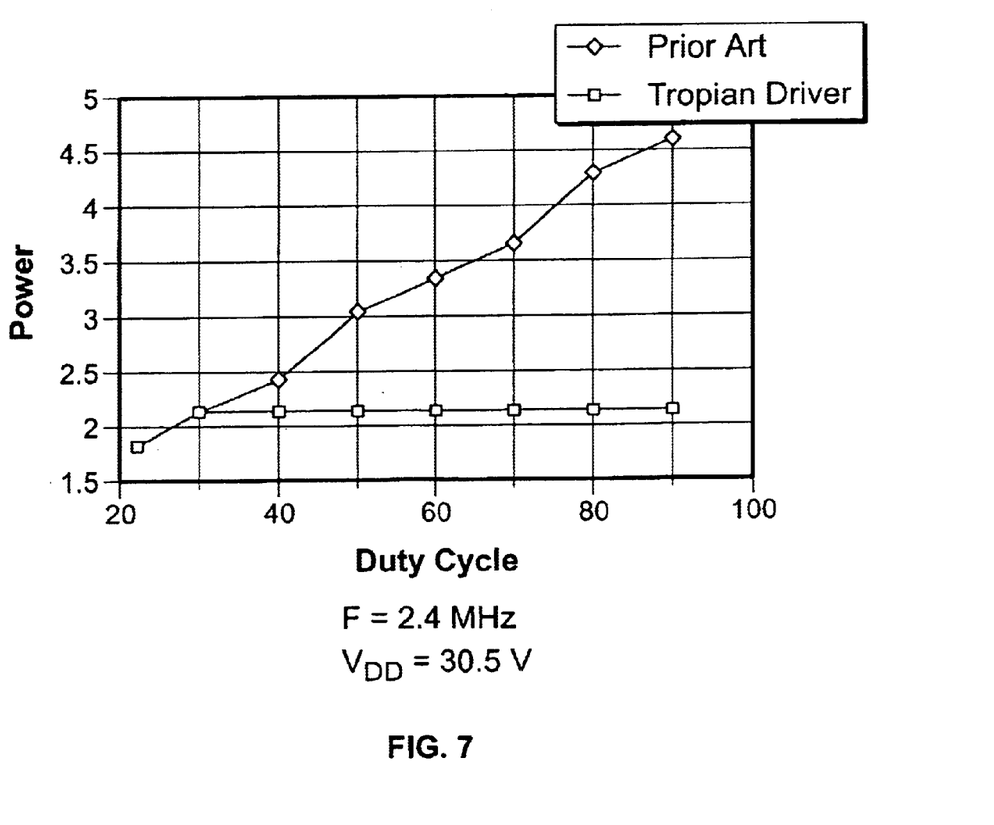
FIG. 7 is a graph comparing power dissipation of a prior art driving circuit and method with the driving circuit and method of the present invention in one embodiment thereof.

FIG. 7 is a graph comparing power dissipation of a prior art driving circuit and method (e.g., FIG. 1 and FIG. 2) with the driving circuit and method of the present invention (e.g., FIG. 3 and FIG. 4) in one embodiment thereof. Here, F=2.4 MHz and $V_{DD}$=30.5V. At very low duty cycles, power dissipation of the two circuits is roughly equal. Thereafter, whereas power dissipation of the prior art circuit increases roughly linearly with increasing duty cycle, power dissipation in accordance with the teachings of the present invention remains constant with increasing duty cycle.

By operating the driver circuit for a switch mode power supply in charge-transfer mode, and placing the driver circuit in a high-output-impedance state at all other times, driver power consumption is dramatically decreased. Charge-transfer mode allows the driver duty cycle to become very low. High speed operation (2 MHz and above) is therefore made possible, at high voltage (e.g., 30V) and high current (e.g., 5A). The principles of the present invention apply not only to buck converters but to a wide variety of implementations and modes including buck, boost, synchronous rectification, etc., both alone and in combination.

Figure 8:
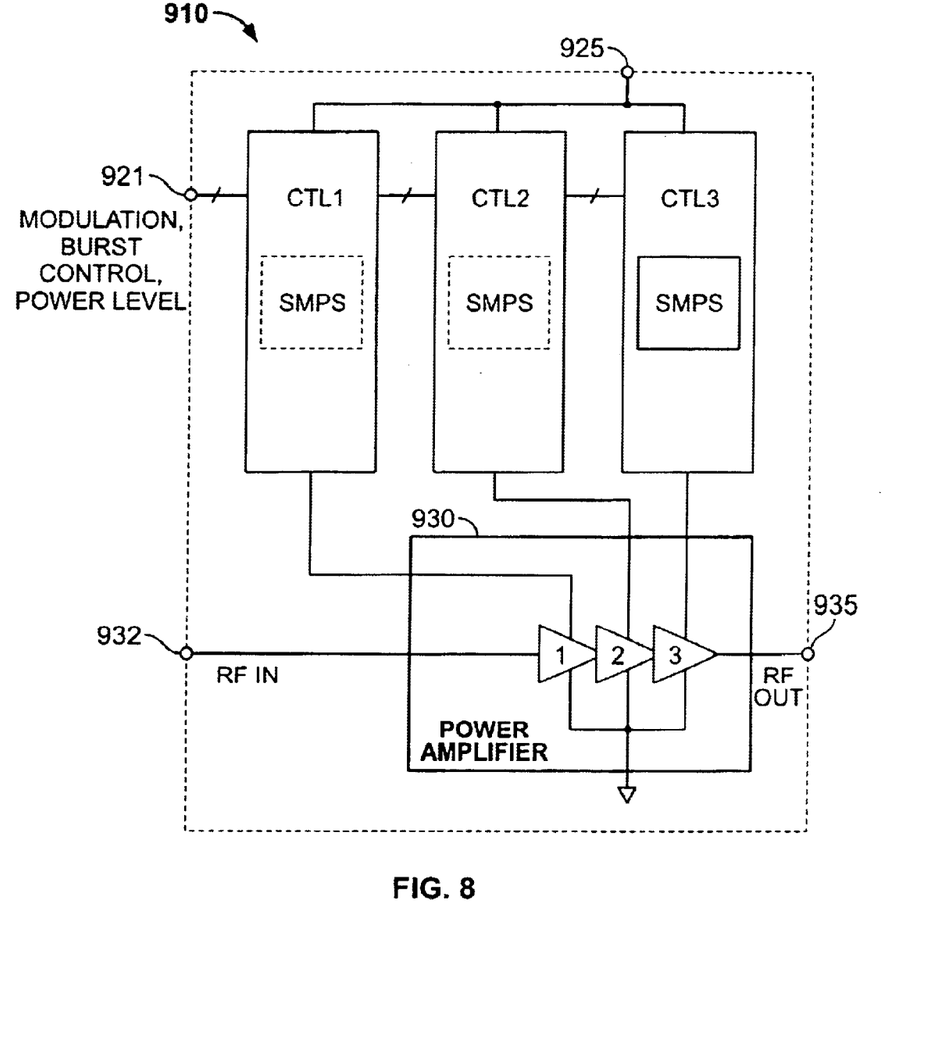
FIG. 8 is a diagram of an RF power amplifier in accordance with another aspect of the present invention.

Referring now to FIG. 8, a diagram of an RF power amplifier in accordance with another aspect of the present invention. As compared to the known power amplifier of FIG. 9, the power amplifier of FIG. 8 uses a switch mode power supply in accordance with the previous teaching of the present description. Accordingly, the envelope-following capability of the switch mode power supply is therefore increased. Furthermore, provision is made for independent control of the power supplies of the multiple stages of the power amplifier. Further details of such independent control may be found in U.S. Pat. No. 6,256,482, in U.S. patent application Ser. No. 09/684,497, and U.S. patent application Ser. No. 09/834,024, all of which are incorporated herein by reference, addressing efficiency of cascaded stages, the reduction of AM/PM distortion, and precise power control over a wide dynamic range.

In particular, the power supply voltages (or currents) for the respective stages of the amplifier in FIG. 8 are separately controlled by separate control circuitry. The control circuitry for the final stage includes a switch mode power supply (SMPS) as previously described. The control circuitry for the preceding driver stage is preferably also provided with such a switch mode power supply, and the pre-driver stage may also be so provided.

The same control mechanism may be used to perform modulation, burst control and power level control, as described in further detail in U.S. patent application Ser. No. 09/637,269, incorporated herein by reference.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of driving a switch mode power supply in accordance with a duty cycle determining a power output of the power supply, using a driving circuit having a first transistor operative during a first portion of the duty cycle for coupling a circuit node of the switch mode power supply to an operating potential and a second transistor operative during a second portion of duty cycle for coupling the circuit node of the switch mode power supply to a reference potential, the method comprising:

driving at least one of the first and second transistors with a pulse having a duration that is less than a duration of a corresponding one of the first portion of the duty cycle and the second portion of the duty cycle; and charging a parasitic capacitance of a power switching transistor during driving the one transistor of the first and second transistors, wherein the charge transferred to the parasitic capacitance maintains the power switching transistor in an on condition for the duration of the corresponding one of the first portion of the duty cycle and the second portion of the duty cycle.

2. The method of claim 1, further comprising:

driving an other of the first and second transistors with a pulse having a duration that is less than a duration of a corresponding one of the first portion of the duty cycle and the second portion of the duty cycle.

3. The method of claim 1 wherein the charge transferred to the parasitic capacitance is less than a maximum charge to which the parasitic capacitance can be charged when configured in the switch mode power supply.

4. The method of claim 1 wherein the duration of the driving pulse is set so that the amount of charge transferred to the parasitic capacitance is just sufficient to maintain the power switching transistor in the on condition for the duration of the corresponding one of the first portion of the duty cycle and the second portion of the duty cycle.

5. A method of driving a synchronous rectification buck converter having a main transistor coupled to a power supply input and to an output filter and a first drive circuit for driving the main transistor, and having a clamping transistor coupled to the main transistor and a second drive circuit for driving the clamping transistor, the method comprising:

to turn on the main transistor, applying an on pulse to a gate electrode of one transistor within the first drive circuit and charging a parasitic capacitance of the one transistor; and relying on charge held on the parasitic capacitance of the one transistor to maintain the main transistor on for a duration at least several times a duration of said on pulse.

6. The method of claim 5, further comprising:

to turn off the main transistor, applying an off pulse to a gate electrode of an other transistor within the first drive circuit.

7. The method of claim 6, further comprising:

to turn on the clamping transistor, applying a different on pulse to a gate electrode of a charge source transistor within the second drive circuit.

8. The method of claim 7, further comprising:

to turn off the clamping transistor, applying a different off pulse to a gate electrode of a charge removal transistor within the second drive circuit.

9. A switch mode power supply comprising:

a transistor switch;

a driver circuit for driving the transistor switch; and a controller, the controller causing the driver circuit to operate in a charge transfer mode in which a pulse of short duration relative to a duty cycle of the switch mode power supply is used to turn on the transistor switch.

10. A method of operating a switch mode power supply having a transistor switch, a driver circuit for driving the transistor switch, and a controller, the method comprising:

controlling the driver circuit to operate in a charge transfer mode in which a pulse of short duration relative to a duty cycle of the switch mode power supply is used to turn on the transistor switch; and during a substantial portion of the duty cycle of the switch mode power supply, placing the driver circuit in a high-output-impedance state.

11. An RF amplification circuit having a phase path and a magnitude path, comprising:

an amplifier having at least a final stage, the amplifier having an RF input coupled to the phase path; and a switch mode power supply coupled to a power supply input terminal of the amplifier, the switch mode power supply including a transistor switch, a driver circuit for driving the transistor switch, and a controller, the controller causing the driver circuit to operate in a charge transfer mode in which a pulse of short duration relative to a duty cycle of the switch mode power supply is used to turn on the transistor switch.

12. A method of amplifying an RF input signal using an amplification circuit including an amplifier having at least a final stage and a switch mode power supply having a transistor switch, a driver circuit and a controller, the method comprising:

applying a constant-envelope phase or frequency modulated RF input signal to an RF input terminal of the amplifier; and producing an amplitude-modulated RF output signal at an output terminal of the amplifier by controlling the driver circuit of the switch mode power supply in a charge transfer mode to convert an operational voltage to a varying power supply voltage and applying the power supply voltage to a power supply terminal of the amplifier;

wherein a pulse of short duration relative to a duty cycle of the switch mode power supply is used to turn on the transistor switch.

* * * * *